United States Patent
Prinz et al.

(10) Patent No.: US 6,751,125 B2
(45) Date of Patent: Jun. 15, 2004

(54) GATE VOLTAGE REDUCTION IN A MEMORY READ

(75) Inventors: Erwin J. Prinz, Austin, TX (US); Craig T. Swift, Austin, TX (US); Jane A. Yater, Austin, TX (US); Sung-Wei Lin, Austin, TX (US); Frank K. Baker, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/287,328

(22) Filed: Nov. 4, 2002

(65) Prior Publication Data

US 2004/0085815 A1 May 6, 2004

(51) Int. Cl.[7] .............................................. G11C 16/04
(52) U.S. Cl. ............................ 365/185.18; 365/185.27; 365/185.24
(58) Field of Search ....................... 365/185.18, 185.27, 365/185.24

(56) References Cited

U.S. PATENT DOCUMENTS

| 5,416,738 A | * | 5/1995 | Shrivastava | ............ | 365/185.24 |
| 5,432,738 A | * | 7/1995 | Watsuji et al. | .......... | 365/185.26 |
| 5,789,776 A | | 8/1998 | Lancaster et al. | | |
| 5,841,700 A | * | 11/1998 | Chang | .................... | 365/185.18 |
| 6,490,196 B1 | * | 12/2002 | Hsu et al. | .............. | 365/185.03 |

FOREIGN PATENT DOCUMENTS

EP            1 168 434 A2       1/2002

* cited by examiner

Primary Examiner—Huan Hoang
(74) Attorney, Agent, or Firm—David G. Dolezal; James L. Clingan, Jr.

(57) ABSTRACT

A technique for reducing the read gate voltage in a memory array including memory cells having a transistor for storing charge indicative of the value stored in the cell. In one example, a voltage greater than the substrate voltage is applied to the sources of the transistors of the memory cells of the array to increase the threshold voltage of a transistor due the body effect. The read gate voltage is greater than the source voltage which is greater than the substrate voltage. A non read voltage of less than the source voltage is applied to the gates of the transistors of the unselected rows to reduce leakage current. With this embodiment, the threshold voltages of transistors having an erased state can be less than 0V. With some embodiments, the read disturb caused by a gate voltage can be reduced due to the reduction in the gate voltage. In other examples, a negative voltage is applied to the gates of unselected rows to prevent leakage current. Accordingly, the voltage thresholds of transistors having an erased state can be reduced, wherein the read gate voltage can be reduced as well.

38 Claims, 2 Drawing Sheets

GATE VOLTAGE REDUCTION IN A MEMORY READ

BACKGROUND OF THE INVENTION

1. Field of the Invention

This invention relates in general to a memory and in particular to a read operation of a memory.

2. Description of the Related Art

Some memories such as non-volatile memories implement single transistor memory cells for storing data. An example of a type of transistor that may be used in such memory cells is a transistor having a gate dielectric that includes an oxide/nitride/oxide (ONO) stack, such as, e.g., a silicon oxide nitride oxide silicon (SONOS) transistor. With such transistors, charge may be stored in the nitride layer to represent a value stored in the memory cell.

One problem with the use of such transistors in a memory array is that a read of a cell of the array may disturb the amount of charge stored in that cell as well as in other cells of the array. This read disturb may be caused by the voltages applied to the cell terminals during a read operation. For example, the voltage applied to the word line may generate an electric field across the transistor dielectric leading to a change in the charge stored in the dielectric. If the charge entering or leaving the dielectric becomes too great, the threshold voltage (Vt) may be altered such that the cell will not provide the proper value when read.

FIG. 1 is a diagram of an erased state threshold voltage distribution for a prior art, single transistor cell, memory array. In a properly functioning array, the threshold voltages of the transistors of the array having an erased state are within a distribution 105 that is located in a region between 0V and the read voltage (Vr). Distribution 105 is located sufficiently below Vr (by the amount which is indicated by "Gate Drive" in FIG. 1) such that each transistor having an erased state provides a sufficient read current to be sensed by a sense amplifier (not shown).

When a read voltage (Vr) is applied to the gate of a transistor, it causes an electric field across the storage dielectric (ONO stack) which can change the amount of charge stored in the nitride, thereby raising the threshold voltage (Vt) of the transistor. The magnitude of the electric field is dependent upon the magnitude of the read voltage (Vr) and the thickness of the dielectric layers in the ONO stack. The magnitude of the electric field is also dependent upon the charge neutral threshold voltage of the transistor which is dependent upon the doping of the channel and the effective gate dielectric thickness, as well as other factors.

Distribution 105 is also located sufficiently above 0 Volts (V) such that all of the transistors having an erased state in a selected column and unselected row will not generate leakage current during a read of a cell in a selected column and a selected row.

Another problem with such transistors is that as the operating voltages of memory arrays decrease, there may be insufficient voltage range between 0V and Vr to have a workable distribution where all transistors have an erased state which will provide sufficient gate drive and immunity to leakage current during a read.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 2:
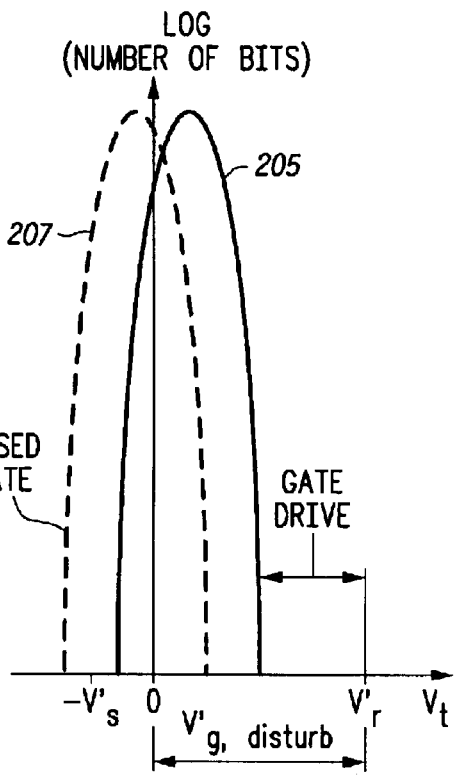
FIG. 2 is a diagram of an erased state threshold voltage distribution for one embodiment of a memory array according to the present invention.

FIG. 2 is a diagram of an erased state threshold voltage distribution for a memory array (not shown) according to the present invention. In one embodiment, the memory array producing the distribution of FIG. 2 is an array of memory cells where each cell includes a transistor (e.g. a SONOS transistor) having a nitride layer for storing charge. The threshold voltage (Vt) of the transistor is dependent upon the charge stored in the nitride layer.

For the embodiment of FIG. 2, the threshold voltages of the transistors of the array having an erased state are located within the threshold voltage distribution 205 when being read. Distribution 205 is located in a region between a voltage value (−Vs') equal to the negative of the voltage applied to the source (Vs') of the transistors during a read and a value equal to the read voltage (Vr') applied to the gates of the transistors of a selected row of the array during a read. Distribution 205 is located sufficiently below Vr' (by an amount which is indicated by "Gate Drive" in FIG. 2) such that each transistor having an erased state will provide a sufficient read current to be read by a sense amplifier (not shown).

Figure 1:
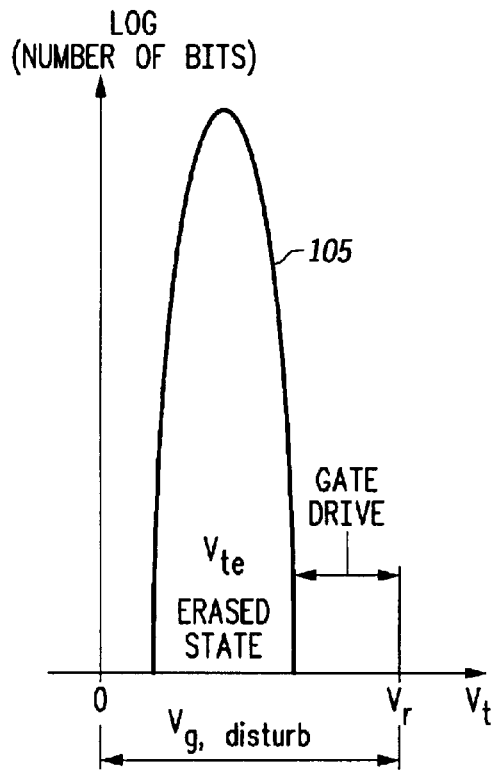
FIG. 1 is a diagram of an erased state threshold voltage distribution for a prior art single, transistor cell, memory array.

Because the maximum threshold voltage of distribution 205 is lower than the maximum threshold of distribution 105 of FIG. 1, the read voltage (Vr) for an array having the distribution 205 of FIG. 2 (the "array of FIG. 2") can be less than the read voltage (Vr) for the array having distribution 105 of FIG. 1 (the "array of FIG. 1"). Because the read voltage Vr for the array of FIG. 1 is lower than the read voltage Vr' for the array of FIG. 2, the read disturb voltage (Vg') for the array of FIG. 2 is also less than the read disturb voltage (Vg) for the array of FIG. 1. Accordingly, the read disturb caused by a read of a cell of the array of FIG. 2 is less than the read disturb caused by a read of a cell of the array of FIG. 1.

Figure 3:
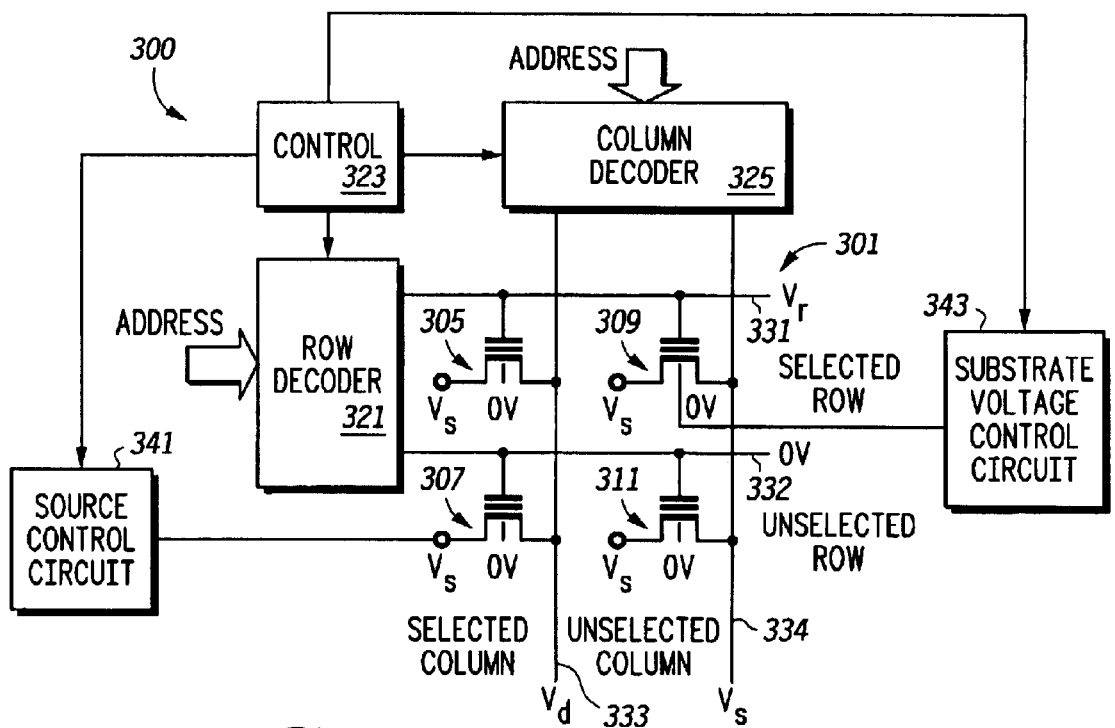
FIG. 3 is a circuit diagram of one embodiment of a memory device according to the present invention.

FIG. 3 is a circuit diagram of a memory device according to the present invention. Memory device 300 includes a memory array 301 of having cells of single transistors (e.g. 305) arranged in rows and columns. Each transistor (e.g. 305) of array 301 includes a gate connected to a word line (e.g. 331) whose voltage is controlled by row decoder 321. Each transistor of array 301 includes a drain connected to a bit line (e.g. 333) whose voltage is controlled by column decoder 325. Row decoder 321 and column decoder 325 are controlled by address lines and control circuit 323 for selecting a specific cell of the array for reading. The voltage of the substrates of the transistors of array 301 controlled by a substrate voltage control circuit 343 which is connected to the substrates of the transistors of array 301 (although only a connection to one substrate is shown in FIG. 3 for simplicity of the Figure). During a read, control circuit 343 pulls the substrates of the transistors of array 301 to ground (0V). The substrate may be connected to negative or positive voltage during program and erase.

Memory device 300 includes a source control circuit 341 for controlling the voltage level of the sources of the transistors of array 301. Control circuit 341 includes an output (or outputs) that is connected to the sources of the transistors of array 301 (although only a connection to the source of transistor 307 is shown in FIG. 3 for simplicity of the Figure). Those of skill in the art will appreciate that a memory device may include other conventional circuitry (not shown). Also, those of skill in the art will appreciate that an array may include more, cells, rows, and/or columns than shown in FIG. 3.

A transistor of array 301 is selected for reading by applying a read voltage (Vr) to the word line (e.g. 331) of the selected cell by row decoder 321 and a reading bit line voltage (Vd) to the bit line (e.g. 333) of the selected cell by column decoder 325. In FIG. 3, transistor 305 is being selected for reading in that Vr is applied to word line 331 and Vd is applied to bit line 333. In FIG. 3, transistors 305 and 309 are in the "selected row" in that their gates are connected to word line 331 which row decoder 321 provides with a voltage of Vr. Transistors 307 and 311 are in an "unselected row" in that their gates are connected to a word line (e.g. 332) in which row decoder 321 provides a non read voltage of 0 Volts.

Also in FIG. 3, transistors 305 and 307 awe in a "selected column" in that their drains are connected to bit line 333 which column decoder 325 provides with a read voltage of Vd. Transistors 309 and 311 are in an unselected column in that their drains are connected to a bit line 334 which column decoder 325 provides a non read voltage of Vs. In one embodiment, Vr=1.5V, Vs=0.5V and Vd=1.0V and the threshold voltages of the transistors having an erased state, when read, are greater than −0.25V.

The transistors having an erased state in array 301 have been discharged to have a threshold voltage that falls within a distribution similar to distribution 207 of FIG. 2 (as shown by the dashed lines). During a read operation of array 301, a source voltage (Vs) (greater than 0V) is applied by control circuit 341 to the source of each transistor. The application of Vs to the sources of the transistors increases the threshold voltage of the transistor due to the body effect. This increase in the threshold voltage is shown in FIG. 2 by the difference between distribution 207 versus distribution 205.

Because the threshold voltage level (Vt) of each transistor having an erased state in array 301 is greater during a read operation (as shown by distribution 205) than −Vs, transistors of the selected column and unselected rows (e.g. 307 ) will not be conductive in that their Vt is greater than the difference (e.g. −0.5V) between Vs (e.g. 0.5) applied to their sources and a non read gate voltage of 0V applied to their gates. This prevents undesired leakage current from transistors on a selected column and unselected rows (e.g. transistor 307 in FIG. 3), thereby preventing a sense amplifier (not shown) located on each column from providing an erroneous reading.

As stated above, applying a voltage Vs to the source of a transistor during a read makes those transistors in selected columns and unselected rows non conductive during a read operation. Accordingly, the transistors of array 301 may be discharged to have a lower Vt, which may be lower than 0V, and not generate leakage current. Because the Vt distribution of the transistors having an erased state in array 301 is lower than distribution 105 in FIG. 1 (distribution 105 is located above 0V), the read voltage (Vr) may be lower for array 301 than for an array of FIG. 1. Accordingly, the disturb voltage (Vg) for the array 301 is less than the disturb voltage for the array of FIG. 1.

During a read operation, Vr is applied to all of the gates of the transistors in the selected row (e.g. transistors 305 and 309). Applying Vr to an unselected transistor (as well as a selected one) generates a disturb electric field in that transistor. With the embodiment of FIG. 3, the lower the read voltage, the lesser the disturb field. Accordingly, providing an array with a lower read voltage may advantageously reduce read disturb generated by a read operation.

In FIG. 3, a non read drain voltage of Vs (the same voltage level that is applied to the sources during a read) is applied to the drains of the transistors of the unselected columns (e.g. transistors 309 and 311) during a read operation. Vr is applied to the gates of the transistors of the selected row (e.g. transistors 305 and 309) to make those transistors conductive. The channels of the transistors of a selected row and unselected column (e.g. 309) are at voltage Vs since those transistors (having an erased state) are conductive and their sources and drains are both at Vs. Because Vs is above the voltage level of the substrate (0V), a "shield" that includes the drain, source, and channel at Vs exists between the substrate (at 0V) and the gate (at Vr which is higher than Vs) for those transistors. The voltage difference between Vs and 0V is dropped across a depletion region beneath the channel. This shield acts to reduce the voltage disturb (Vg disturb) from Vg=Vr to Vg=Vr−Vs for transistors in selected row an unselected columns (e.g. transistor 309), thereby reducing the read disturb.

Figure 4:
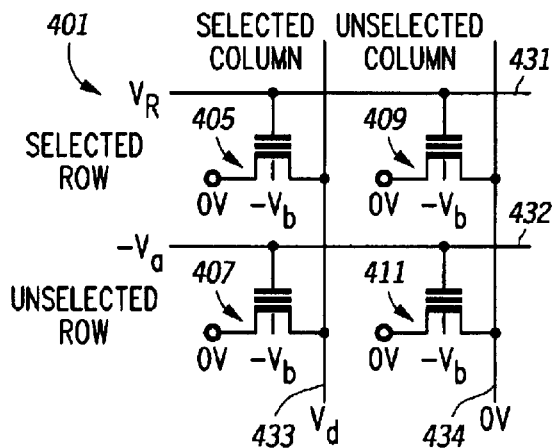
FIG. 4 is a circuit diagram of another embodiment of a memory array according to the present invention.

FIG. 4 is a circuit diagram of another memory array according to the present invention. Memory array 401 includes single transistor memory cells (e.g. 405) arranged in rows and columns. Bit lines 433 and 434 are coupled to a column decoder (not shown) and word lines 431 and 432 are coupled to a row decoder (not shown). The substrates of the transistors of FIG. 4 are connected to a negative voltage (−Vb). Also not shown in FIG. 4 are a control circuit (e.g. 323), a substrate voltage control circuit (e.g. 343), and a source control circuit (e.g. 341).

During a read operation, a row decoder (not shown) applies a read voltage Vr to the word line of the selected row and a negative voltage (−Va) to the word line of the non selected row. Also during a read operation, a column decoder (not shown) applies a read drain voltage (Vd) to the bit line of the selected column and non read voltage of 0V to the bit lines of the unselected columns. In FIG. 4, transistor 405 is selected for reading in that read voltage (Vr) is applied to word line 431 and read drain voltage Vd is applied to bit line 433. Also, during a voltage read, the sources of the transistors are at ground (0V). In one embodiment, Vr=1.8 V, −Vb=−0.5V, −Va=−0.5V, and Vd=1V. In other embodiments, −Va may be different from −Vb, e.g. −Va=−1V and −Vb=−0.5V.

As stated above, the sources of the transistors of FIG. 4 are connected to 0V during a read operation. Because the source is at a higher voltage (0V) than the substrate (−Vb) during a read, the threshold voltages of the transistors of array 401 having an erased state are shifted to a higher voltage due to the body effect.

A negative voltage (−Va) is applied to the gates of transistors of the unselected rows (e.g. 407 and 411). −Va is selected such that it is less than the lowest threshold voltage of transistors of array 401 having an erased state during a read operation. Accordingly, the transistors of the selected column and unselected rows (e.g. transistor 407) are non conducting and provide no leakage current to a sense amplifier (not shown) coupled to that column. Furthermore, because −Va is a negative voltage, the transistors of array 401 having an erased state, may have threshold voltages that are less than 0V during a read operation.

As with the embodiment of FIG. 3, because the source voltage is at a higher voltage (0V) than the substrate (−Vb) and because the drain of transistors of unselected columns are at the same voltage as the source (0V), for the unselected transistors of the selected row (e.g. 409), the source, drain, and channel (due to the gate being at a read voltage of Vr for the selected row) provides a "shield" 0V between the gate at Vr and the substrate of −Vb. This shield reduces the disturb voltage from Vg=Vr+(−Vb) to Vr, thereby reducing the read disturb on transistors of the selected row and unselected columns (e.g. transistor 409).

Figure 5:
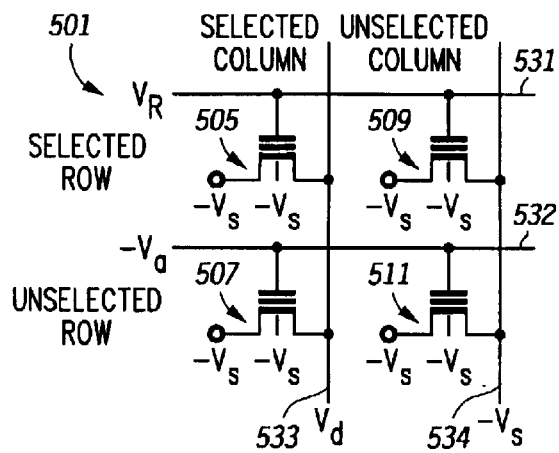
FIG. 5 is a circuit diagram of another embodiment of a memory array according to the present invention.

FIG. 5 is circuit diagram of another memory array according to the present invention. Memory array 501 includes single transistor memory cells (e.g. 505) arranged in rows and columns. Bit lines 533 and 534 are coupled to a column decoder (not shown) and word lines 531 and 532 are coupled to a row decoder (not shown). The substrates of the transistors of FIG. 5 are connected to a negative voltage (−Vs).

During a read operation, a row decoder (not shown) applies a read voltage Vr to the word line of the selected row and a negative voltage (−Va) to the word lines of the non selected rows. Also during a read operation, a column decoder (not shown) applies a read drain voltage (Vd) to the bit line of the selected column and non read voltage of −Vs to the bit lines of the unselected columns.

In FIG. 5, transistor 505 is selected for reading in that read voltage Vr is applied to word line 531 and read drain voltage Vd is applied to bit line 533. Also, during a read, a negative voltage of −Vs is applied to the sources of the transistors of array 501. Because the sources are tied to a negative voltage, a lower read voltage (Vr) may be applied to the gate and still provide the appropriate voltage between the source and gate (Vgs) to make the transistor conductive. In one embodiment, Vr=1.0 V, −Va=−0.5V, −Vs=−0.5V, and Vd=0.5V.

In the embodiment of FIG. 5, the threshold voltages of the transistors having an erased state are all above 0V. Because a negative non read voltage (−Va) is applied to the gates of the transistors of the unselected rows (e.g. transistors 507 and 511), no leakage current is provided from the transistors of the selected column and unselected row (e.g. 507) during a read in that the gate voltage of these transistors (−Va) is less than the threshold voltages of the transistors having erased states (greater than 0V). Thus, there is no leakage current from the unselective transistors (e.g. 507) of the selected columns. In the embodiment of FIG. 5, the value of −Va may be less than or equal to −Vs.

Figure 6:
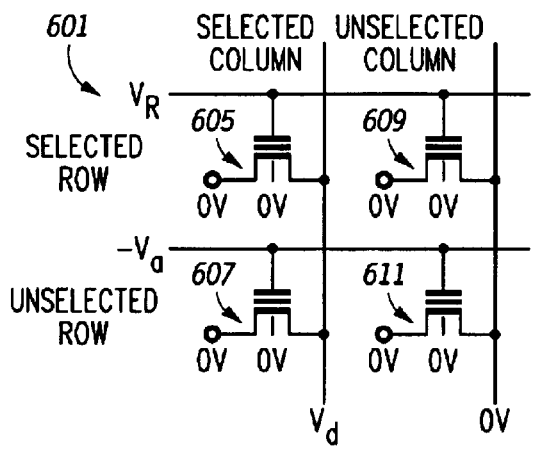
FIG. 6 is a circuit diagram of another embodiment of a memory array according to the present invention.

FIG. 6 is an other embodiment of a memory array according to the present invention. The embodiment of FIG. 6 is similar to the embodiment of FIG. 4 except that the source and the substrate are at the same voltage (0V) during a read. During a read, a negative voltage (−Va) is applied to the gates of the unselected rows (e.g. 607 and 611). Accordingly, the transistor of array 601 having an erased state may have threshold voltages below 0V (but greater than −Va) and still provide no leakage current when located in a selected column and unselected row (e.g. such as with transistor 607 in FIG. 6). Because the transistors of array 601 may have lower Vts, the read voltage applied to the gate may be lower, thereby reducing the read disturb voltage. In one embodiment, Vr=1.0V and Vd=0.5V.

Those of skill in the art will recognize that, based upon the teachings herein, several modifications may be made to the embodiments shown in FIGS. 2–6 and the accompanying drawings. The present invention may be implemented in memory arrays having different configurations and for memory having memory cells of different transistor types and/or configurations such as, e.g., memory arrays utilizing memory cells having silicon nanocrystals embedded in a gate dielectric, or conventional floating gate bit cells.

In one aspect, the invention includes a method of performing a read of a memory having a plurality of memory cells. Each memory cell includes a transistor having a gate, a substrate, a source, and a drain. The method includes applying a first voltage, a second voltage, and a third voltage to the gates, sources, and substrates, respectively, of transistors of memory cells in a selected row. The first voltage is greater than the second voltage, and the second voltage is greater than the third voltage. The method also includes applying a fourth voltage, the second voltage, and the third voltage to the gates, sources, and substrates, respectively, of transistors of memory cells in an unselected row. The fourth voltage is less than the second voltage.

In another aspect, the invention includes a method of performing a read of a memory having a plurality of memory cells. Each memory cell includes a transistor having a gate, a substrate, a source, and a drain. The method includes applying a first positive voltage to the gates, a second positive voltage to the sources, and a ground potential to the substrates of transistors of the memory cells of a selected row. The first positive voltage is greater than the second positive voltage.

In another aspect, the invention includes a method of performing a read of a memory having a plurality memory cells. Each memory cell includes a transistor having a gate, a substrate, a source, and a drain. The method includes applying a positive voltage to the gates of transistors of memory cells in a selected row and applying a negative voltage to the gates of transistors of memory cells in an unselected row.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of performing a read of a memory having a plurality of memory cells, each memory cell including a transistor having a gate, a substrate, a source, and a drain, the method comprising:

applying a first voltage, a second voltage, and a third voltage to the gates, sources, and substrates, respectively, of transistors of memory cells in a selected row wherein the first voltage is greater than the second voltage and the second voltage is greater than the third voltage; and applying a fourth voltage, the second voltage, and the third voltage to the gates, sources, and substrates, respectively, of transistors of memory cells in an unselected row, wherein the fourth voltage is less than the second voltage;
applying a fifth voltage to the drains of memory cells of the unselected column.

2. The method of claim 1, wherein the third voltage is ground.

3. The method of claim 2, wherein the third voltage and the fourth voltage are equal.

4. The method of claim 1, wherein the third voltage is negative.

5. The method of claim 1 wherein the fourth voltage is a negative.

6. The method of claim 1, further comprising:
applying a sixth voltage to the drains of memory cells of a selected column, wherein the sixth voltage is greater than the second voltage; and
where the fifth voltage is less than the sixth voltage.

7. The method of claim 6 further wherein the fifth voltage is equal to the second voltage.

8. The method of claim 1 wherein the transistor of each memory cell includes a storage layer for storing charge, wherein a threshold voltage of each transistor is dependent upon charge stored in die storage layer.

9. The method of claim 8 wherein the storage layer includes a nitride layer.

10. The method of claim 1 wherein the transistor of each memory cell includes a gate dielectric, the gate dielectric includes an oxide/nitride/oxide stack.

11. The method of claim 1 wherein the memory cells are non-volatile memory cells.

12. The method of claim 1 wherein the memory cells having an erased state each have a threshold voltage, which when a memory cell is being read, is greater than the fourth voltage minus the second voltage.

13. The method of claim 1 comprising:
applying a sixth voltage to the drains of memory cells of a selected column.

14. The method of claim 13 wherein the sixth voltage is greater than the second voltage.

15. The method of claim 13 wherein the fifth voltage is less than the sixth voltage.

16. The method of claim 1 wherein the fifth voltage is equal to the second voltage.

17. A method of performing a read of a memory having a plurality of memory cells, each memory cell including a transistor having a gate, a substrate, a source, and a drain, the method composing:
applying a first voltage, a second voltage, and a third voltage to the gates, sources, and substrates, respectively, of transistors of memory cells in a selected row wherein the first voltage is greater than the second voltage and the second voltage is greater than the third voltage;
applying a fourth voltage, the second voltage, and the third voltage to the gates, sources, and substrates, respectively, of transistors of memory cells in an unsealed row, wherein the fourth voltage is less than the second voltage;
wherein the third voltage is negative;
wherein the fourth voltage is negative and different from the third voltage.

18. A method of performing a read of a memory having a plurality of memory cells, each memory cell including a transistor having a gate, a substrate, a source, and a drain, the method comprising:
applying a first positive voltage to the gates, a second positive voltage to the sources, and a ground potential to the substrates of transistors of the memory cells of a selected row, wherein the first positive voltage is greater than the second positive voltage;
applying a third positive voltage to the drains of transistors of the memory cells of an unselected column.

19. The method of claim 18, further comprising:
applying ground potential to the gates, the second positive voltage to the sources, and ground potential to the substrates of transistors of the memory cells of a non selected row.

20. The method of claim 18, wherein the third positive voltage is equal to the second positive voltage.

21. The method of claim 18 further comprising:
applying a fourth positive voltage to the drains of transistors of the memory cells of a selected column, wherein the fourth positive voltage is greater than the second positive voltage.

22. The method of claim 18 wherein the transistor of each memory cell includes a storage layer for storing charge, wherein a threshold voltage of each transistor is dependent upon charge stored in the storage layer.

23. The method of claim 22 wherein the storage layer includes a nitride layer.

24. The method of claim 18 wherein the transistor includes a gate dielectric, the gate dielectric includes an oxide/nitride/oxide stack.

25. A method of performing a read of a memory having a plurality memory cells, each memory cell including a transistor having a gate, a substrate, a source, and a drain, the method comprising:
applying a positive voltage to the gates of transistors of memory cells in a selected row;
applying a negative voltage to the gates of transistors of memory cells in an unselected row;
applying a second negative voltage to the sources of transistors of memory cells in a selected row; and
applying the second negative voltage to the sources of transistors of memory cells in an unselected row.

26. The method of claim 25 further comprising:
applying the second negative voltage to the substrates of transistors of memory cells in a selected row; and
applying the second negative voltage to the substrates of transistors of memory cells in an unselected row.

27. The method of claim 25 wherein the second negative voltage is greater than the negative voltage.

28. The method of claim 25 further comprising:
applying the second negative voltage to the drains of transistors of memory cells in an unselected column.

29. The method of claim 25 wherein the transistor of each memory cell includes a storage layer for storing charge, wherein a threshold voltage of the transistor is dependent upon charge stored in the storage layer.

30. The method of claim 29 wherein the storage layer includes a nitride layer.

31. The method of claim 25 wherein the transistor includes a gate dielectric, the gate dielectric includes an oxide/nitride/oxide stack.

32. The method of claim 25 wherein the memory cells are a non-volatile memory cells.

33. The method of claim 25 wherein the memory cells having an erased state have threshold voltages, when read, of greater than the negative voltage minus a voltage applied to the sources of the memory cells.

34. The method of claim 25 further comprising:
applying a second positive voltage to the drains of transistors of memory cells in a selected column.

35. A method of performing a read of a memory having a plurality memory cells, each memory cell including a transistor having a gate, a substrate, a source, and a drain, the method comprising:

applying a positive voltage to the gates of transistors of memory cells in a selected row;

applying a negative voltage to the gates of transistors of memory cells in an unselected row;

applying a ground voltage to the sources and a second negative voltage to the substrates of transistors of memory cells in a selected row;

applying the ground voltage to the sources and the second negative voltage to the substrates of transistors of memory cells in an unselected row; and applying the ground voltage to the drains of transistors of memory cells in an unselected column.

36. The method of claim 35, wherein the negative voltage is different from the second negative voltage.

37. The method of claims 35 further comprising:

applying a second positive voltage to the drains of transistors of memory cells in a selected column.

38. A method of performing a read of a memory having a plurality memory cells, each memory cell including a transistor having a gate, a substrate, a source, and a drain, the method comprising:

applying a positive voltage to the gates of transistors of memory cells in a selected row;

applying a negative voltage to the gates of transistors of memory cells in an unselected row;

applying a first voltage to the drains of transistors of memory cells in a selected column;

applying a second voltage to the drains of transistors of memory cells in an unselected column, wherein the first voltage is greater than the second voltage;

applying a second negative voltage to the substrates of transistors of memory cells in a selected row; and applying the second negative voltage to the substrates of transistors of memory cells in an unselected row.

* * * * *

UNITED STATES PATENT AND TRADEMARK OFFICE
CERTIFICATE OF CORRECTION

PATENT NO. : 6,751,125 B2
DATED : June 15, 2004
INVENTOR(S) : Erwin J. Prinz et al.

It is certified that error appears in the above-identified patent and that said Letters Patent is hereby corrected as shown below:

Column 7,
Line 5, delete "where" and replace with -- wherein --.
Line 14, delete "unsealed" and replace with -- unselected --.

Signed and Sealed this

Sixteenth Day of August, 2005

JON W. DUDAS
*Director of the United States Patent and Trademark Office*